(12) United States Patent
Degura

(10) Patent No.: US 11,570,939 B2
(45) Date of Patent: Jan. 31, 2023

(54) LEAD CUTTING SYSTEM

(71) Applicant: FUJI CORPORATION, Chiryu (JP)

(72) Inventor: Kazuya Degura, Toyota (JP)

(73) Assignee: FUJI CORPORATION, Chiryu (JP)

( * ) Notice: Subject to any disclaimer, the term of this patent is extended or adjusted under 35 U.S.C. 154(b) by 87 days.

(21) Appl. No.: 16/982,736

(22) PCT Filed: Mar. 26, 2018

(86) PCT No.: PCT/JP2018/011972
§ 371 (c)(1),
(2) Date: Sep. 21, 2020

(87) PCT Pub. No.: WO2019/186613
PCT Pub. Date: Oct. 3, 2019

(65) Prior Publication Data
US 2021/0007254 A1    Jan. 7, 2021

(51) Int. Cl.
*H05K 13/04*    (2006.01)
*H05K 13/00*    (2006.01)

(52) U.S. Cl.
CPC ..... *H05K 13/0473* (2013.01); *H05K 13/0084* (2013.01); *H05K 13/0413* (2013.01); *Y10T 29/53183* (2015.01)

(58) Field of Classification Search
CPC ........... H05K 13/0413; H05K 13/0473; H05K 13/0084; Y10T 29/53183
See application file for complete search history.

(56) References Cited

U.S. PATENT DOCUMENTS

| | | | | |
|---|---|---|---|---|
| 5,123,154 A | * | 6/1992 | Maskens | H05K 13/0473 140/105 |
| 5,797,178 A | * | 8/1998 | Inaba | 29/838 |
| 5,864,945 A | * | 2/1999 | Imai | H05K 13/0473 29/838 |

FOREIGN PATENT DOCUMENTS

| | | |
|---|---|---|
| JP | 53-156382 U | 12/1978 |
| JP | 2002-156463 A | 5/2002 |
| JP | 2011119554 A * | 6/2011 |
| JP | 2012-156463 A | 8/2012 |
| JP | 2017-63118 A | 3/2017 |
| JP | 2017-157690 A | 9/2017 |

OTHER PUBLICATIONS

W. Xu et al., "Research and Application of Automatic Shaping and Processing Equipment for Distribution Lines," 2018 IEEE 4th Information Technology and Mechatronics Engineering Conference (ITOEC), 2018, pp. 1446-1449. (Year: 2018).*
International Search Report dated May 15, 2018 in PCT/JP2018/011972 filed on Mar. 26, 2018, 2 pages.

* cited by examiner

*Primary Examiner* — A. Dexter Tugbang
(74) *Attorney, Agent, or Firm* — Oblon, McClelland, Maier & Neustadt, L.L.P.

(57) ABSTRACT

A lead-cutting system, comprising: a rotation device configured to rotate a rotary table; a cutting device, being disposed on the rotary table, which is configured to cut leads of a lead component inserted into through-holes in a board; and a container, being disposed on the rotary table together with the cutting device, which contains leads cut by the cutting device.

5 Claims, 16 Drawing Sheets

LEAD CUTTING SYSTEM

TECHNICAL FIELD

The present disclosure relates to a lead-cutting system or the like having a cutting device for cutting leads of a lead component that is inserted into through-holes in a board.

BACKGROUND ART

Patent Literature 1 below describes a container for containing leads, that is, lead scraps cut by a cutting device. Patent Literature 2 describes a container for containing defective electronic components.

PATENT LITERATURE

Patent Literature 1: Japanese Patent Application Laid-Open No. 2017-157690
Patent Literature 2: Japanese Patent Application Laid-Open No. 2002-156463

BRIEF SUMMARY

Technical Problem

As described in the above-mentioned Patent Literature, it is desirable to appropriately contain lead scraps and the like in a container. Therefore, it is an object of the present disclosure to ensure appropriate containment of lead scraps in a container.

Solution to Problem

In order to solve the above problem, the present specification discloses a lead-cutting system, comprising: a rotation device configured to rotate a rotary table; a cutting device, being disposed on the rotary table, which is configured to cut leads of a lead component inserted into through-holes in a board; and a container, being disposed on the rotary table together with the cutting device, which contains the leads cut by the cutting device.

In order to solve the above problems, the present specification discloses a lead component mounting system comprising: a holding head configured to hold a lead component; a head moving device configured to move the holding head so that leads of a lead component held by the holding head are inserted into through-holes in a board; a rotation device configured to rotate a rotary table; a cutting device, being disposed on the rotary table, which is configured to cut leads of a lead component inserted into the through-holes; and a container, being disposed on the rotary table together with the cutting device, which contains the leads cut by the cutting device.

Advantageous Effects

The present disclosure allows the container to rotate with the cutting device to ensure appropriate containment of lead scraps, discarded from the cutting device, into the container.

DESCRIPTION OF EMBODIMENTS

Hereinafter, as a form for carrying out the present disclosure, embodiments of the present disclosure are described in detail with reference to the drawings.

Figure 1:
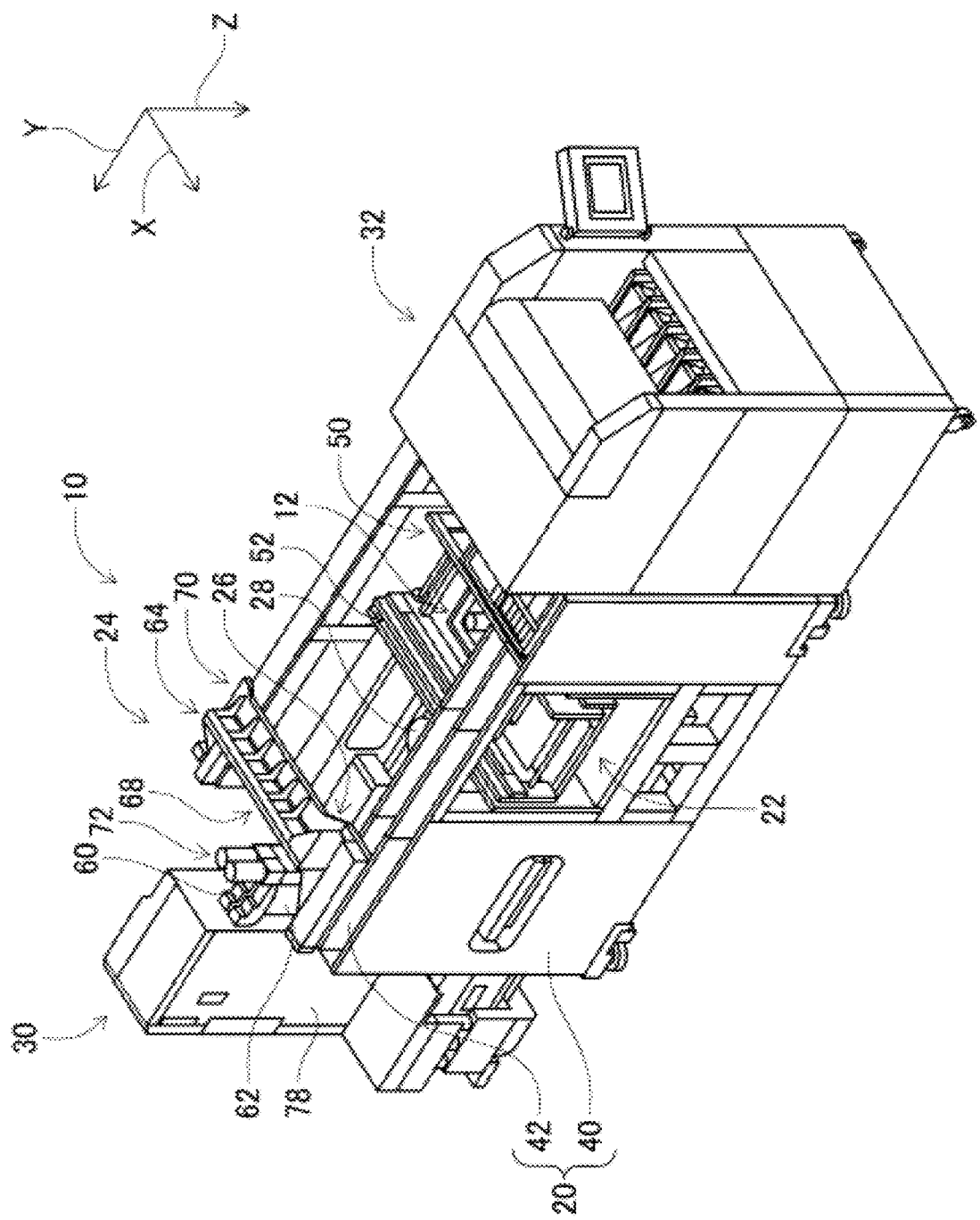
FIG. 1 A perspective view showing a component mounting machine.

FIG. 1 shows component mounting machine 10. Component mounting machine 10 is a device for performing a mounting operation of components on circuit substrate 12. Component mounting machine 10 includes device body 20, substrate conveyance and holding device 22, component mounting device 24, mark camera 26, part camera 28, component supply device 30, bulk component supply device 32, cut-and-clinch device (refer to FIG. 3) 34, and control device (refer to FIG. 6) 36. It should be noted that a circuit board, a substrate of a three-dimensional structure, or the like can be used as circuit substrate 12, and a printed wiring board, a printed circuit board, and the like can be used as a circuit board.

Device main body 20 is constituted by frame portion 40 and beam portion 42 overlaid on frame portion 40. Substrate conveyance and holding device 22 is disposed at the center of the front-rear direction of frame portion 40, and has conveyance device 50 and clamping device 52. Conveyance device 50 is a device for conveying circuit substrate 12, and clamping device 52 is a device for holding circuit substrate 12. Thus, substrate conveyance and holding device 22 conveys circuit substrate 12 and fixedly holds circuit substrate 12 at a predetermined position. In the following description, the conveyance direction of circuit substrate 12 is referred to as the X-direction, the horizontal direction perpendicular to the X-direction is referred to as the Y-direction, and the vertical direction is referred to as the Z-direction. That is, the width direction of component mounting machine 10 is the X-direction, and the front-rear direction is the Y-direction.

Figure 2:
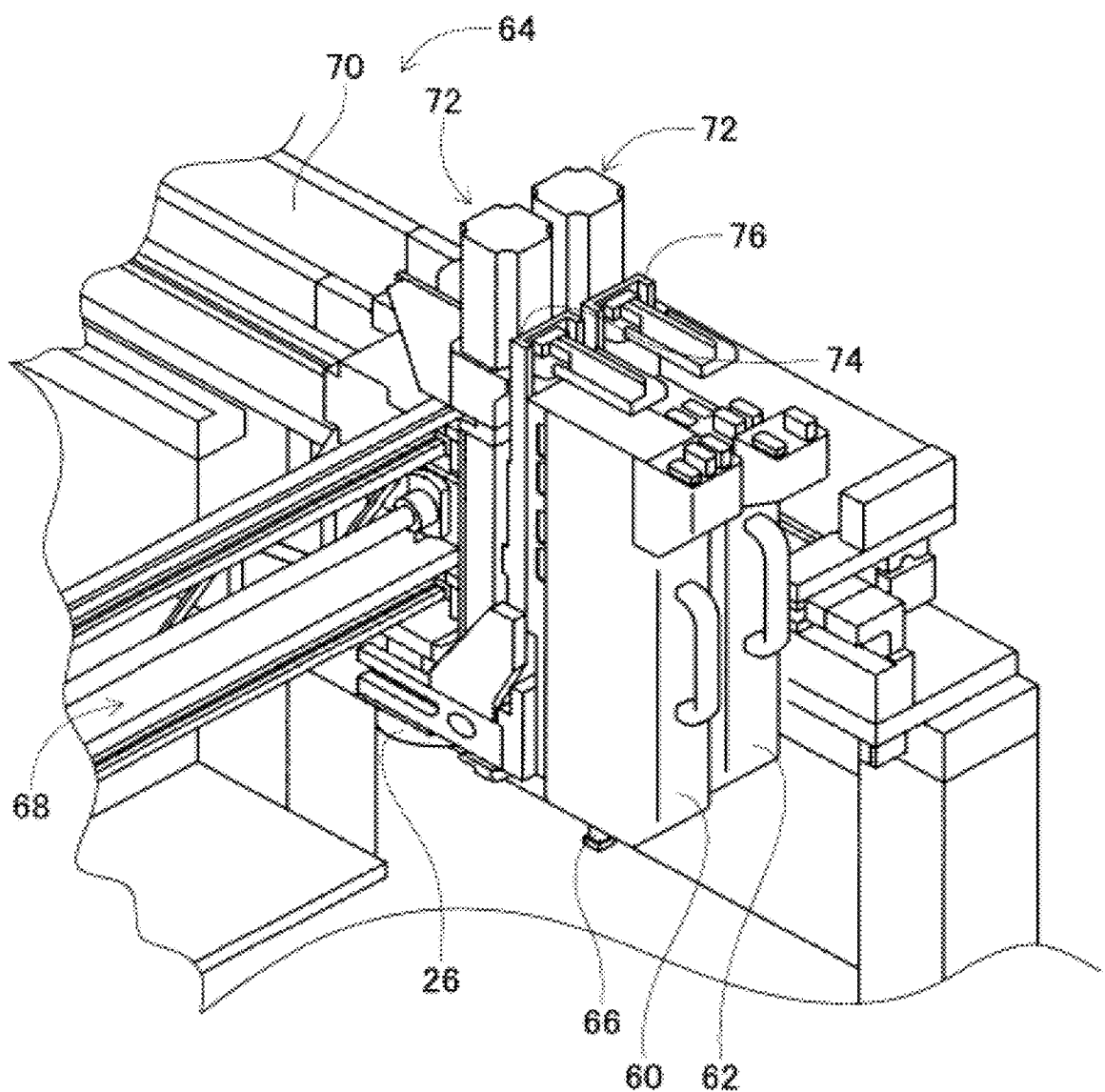
FIG. 2 A perspective view showing a component mounting device.

Component mounting device 24 is disposed on beam portion 42 and includes two work heads 60,62 and work head moving device 64. On the lower face of each of work heads 60,62, as shown in FIG. 2, suction nozzle 66 is provided to pick up and hold a component. Further, work head moving device 64 has X-direction moving device 68, Y-direction moving device 70, and Z-direction moving device 72. Two work heads 60,62 are integrally moved to any position on frame portion 40 by X-direction moving device 68 and Y-direction moving device 70. Work heads 60,62 are detachably attached to sliders 74,76, and Z-direction moving device 72 moves sliders 74,76 individually in the up-down direction. In other words, work heads 60,62 are individually moved in the up-down direction by Z-direction moving device 72.

Mark camera 26 is attached to slider 74 while facing downward, and together with work head 60, is moved in the X-direction, Y-direction, and Z-direction. Thus, mark camera 26 images any position on frame portion 40. Part camera 28, as shown in FIG. 1, is disposed between substrate conveyance and holding device 22 and component supply device 30 on frame portion 40 while facing upward. Thus, part camera 28 images component gripped with suction nozzles 66 of work heads 60,62.

Component supply device 30 is disposed at one end in the front-rear direction of frame portion 40. Component supply 30 has tray-type component feeder 78 and feeder-type component feeder (refer to FIG. 6) 80. Tray-type component feeder 78 is a device for supplying components placed on a tray. Feeder-type component feeder 80 is a device for supplying components by a tape feeder or stick feeder (not shown).

Bulk component supply device 32 is disposed at the other end in the front-rear direction of frame portion 40. Bulk component supply device 32 is a device for aligning scattered multiple components and supplying the components in an aligned state. That is, bulk component supply device 32 is a device for aligning multiple components in any orientation to a predetermined orientation, and supplying the components in a predetermined orientation. It should be noted that the component supplied by component supply device 30 and bulk component supply device 32 can be an electronic circuit component, a component of a solar cell, a component of a power module, or the like. Further, the electronic circuit component can be a component having leads, a component without leads, or the like.

Figure 3:
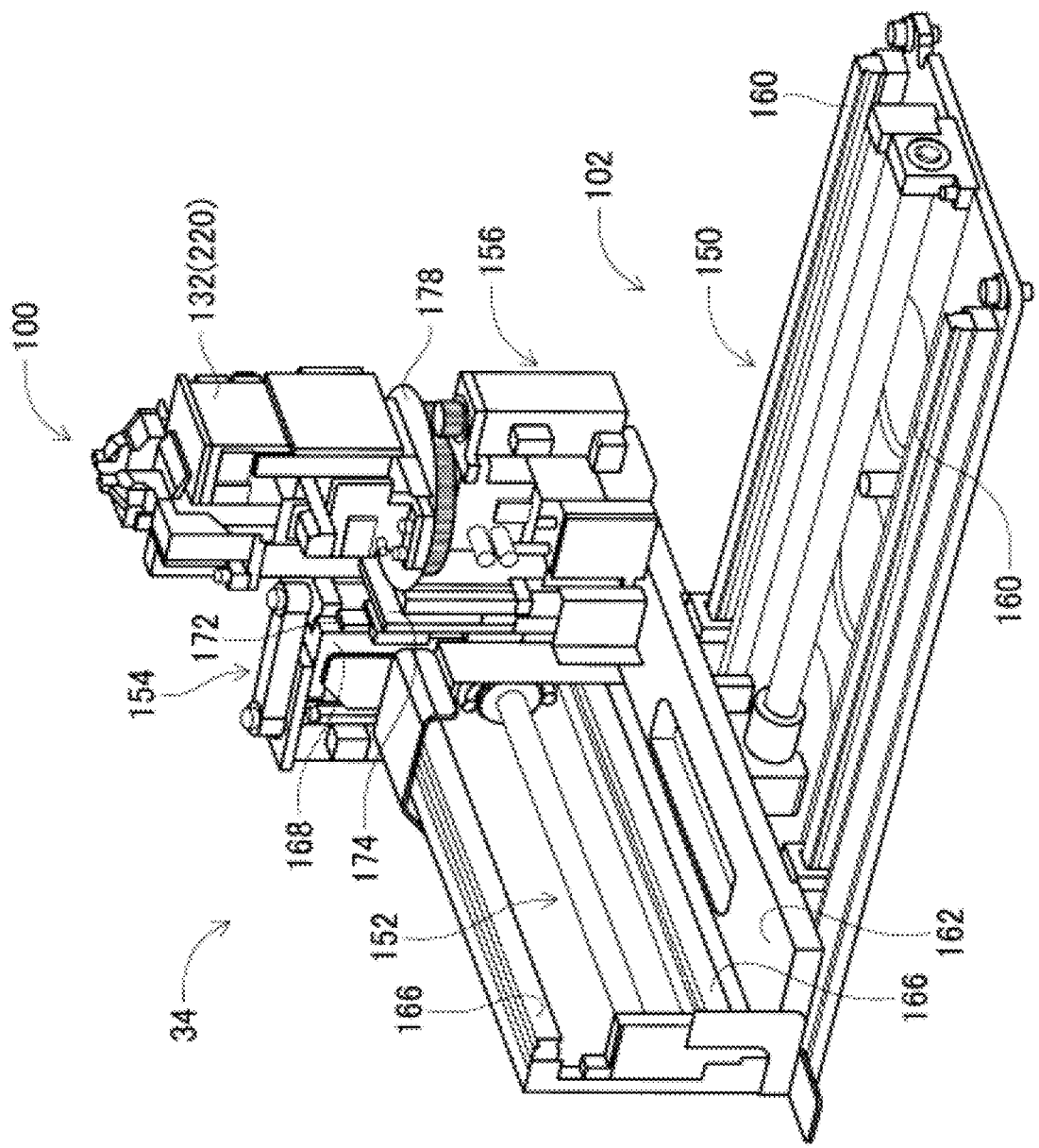
FIG. 3 A perspective view showing a cut-and-clinch device.
Figure 4:
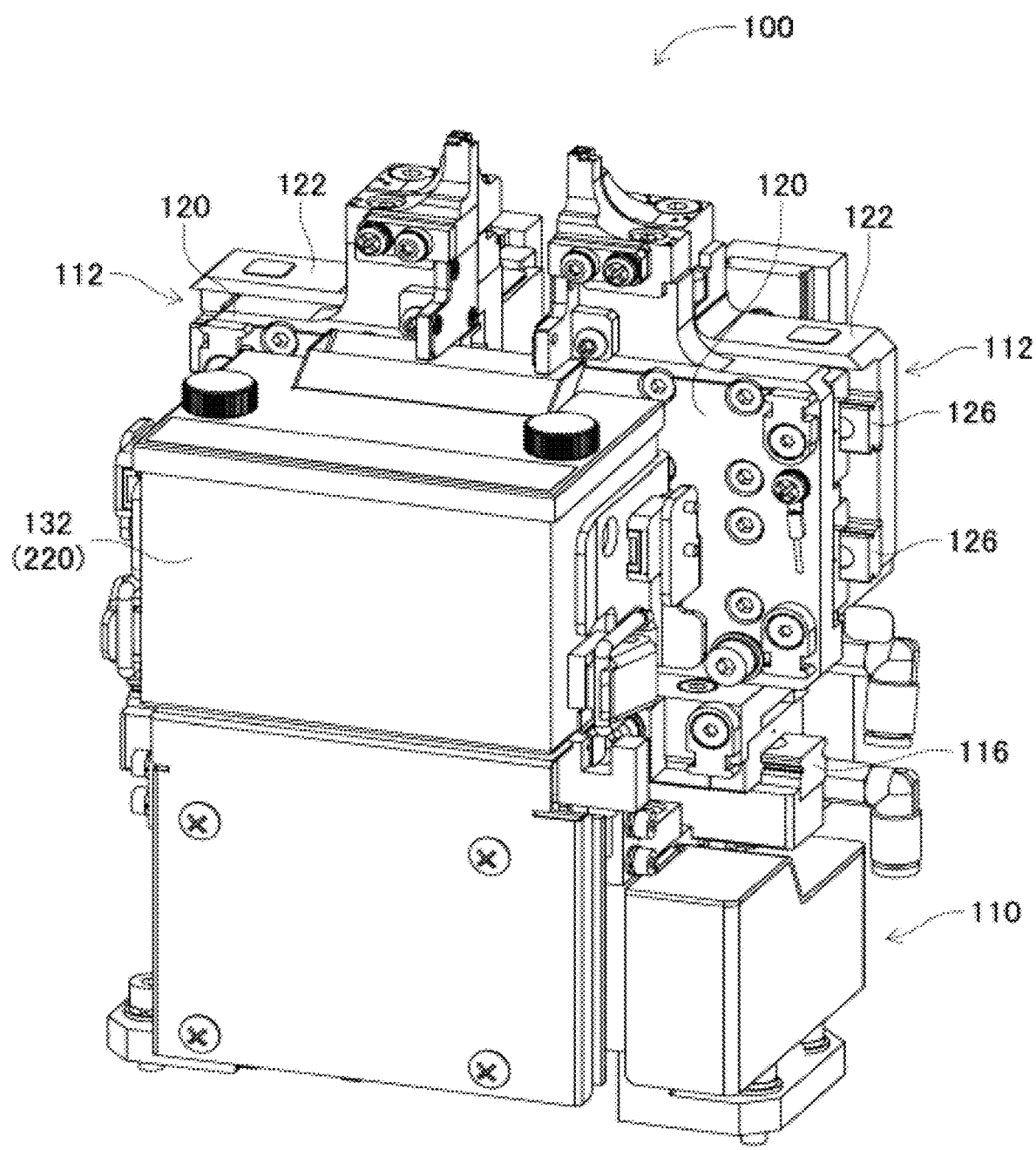
FIG. 4 A perspective view showing a cut-and-clinch unit.

Cut-and-clinch device 34 is disposed below conveyance device 50, and, as shown in FIG. 3, has cut-and-clinch unit 100 and unit moving device 102. Cut-and-clinch unit 100 is a device for cutting and bending leads (refer to FIG. 7) 108 of lead components (refer to FIG. 7) 106 inserted into through-holes 104 in circuit substrate 12 (refer to FIG. 7). As shown in FIG. 4, cut-and-clinch unit 100 includes unit main body 110 and a pair of sliding bodies 112. At the upper end of unit main body 110, slide rail 116 is disposed extending in the X-direction. The pair of sliding bodies 112 are slidably supported by slide rails 116. With this configuration, the pair of sliding bodies 112 come together and separate from each other in the X-direction. The distance between the pair of sliding bodies 112 is also controllably changed by the driving of electromagnetic motor (see FIG. 6) 118.

Further, each of the pair of sliding bodies 112 has fixed portion 120 and movable portion 122, and slide rail 116 is slidably held in fixed portion 120. On the back side of fixed portion 120, two slide rails 126 are fixed so as to extend in the X-direction, and movable portion 122 is slidably held by the two slide rails 126. Movable portion 122 is controllably slid in the X-direction with respect to fixed portion 120 by the driving of electromagnetic motor (see FIG. 6) 128.

Figure 5:
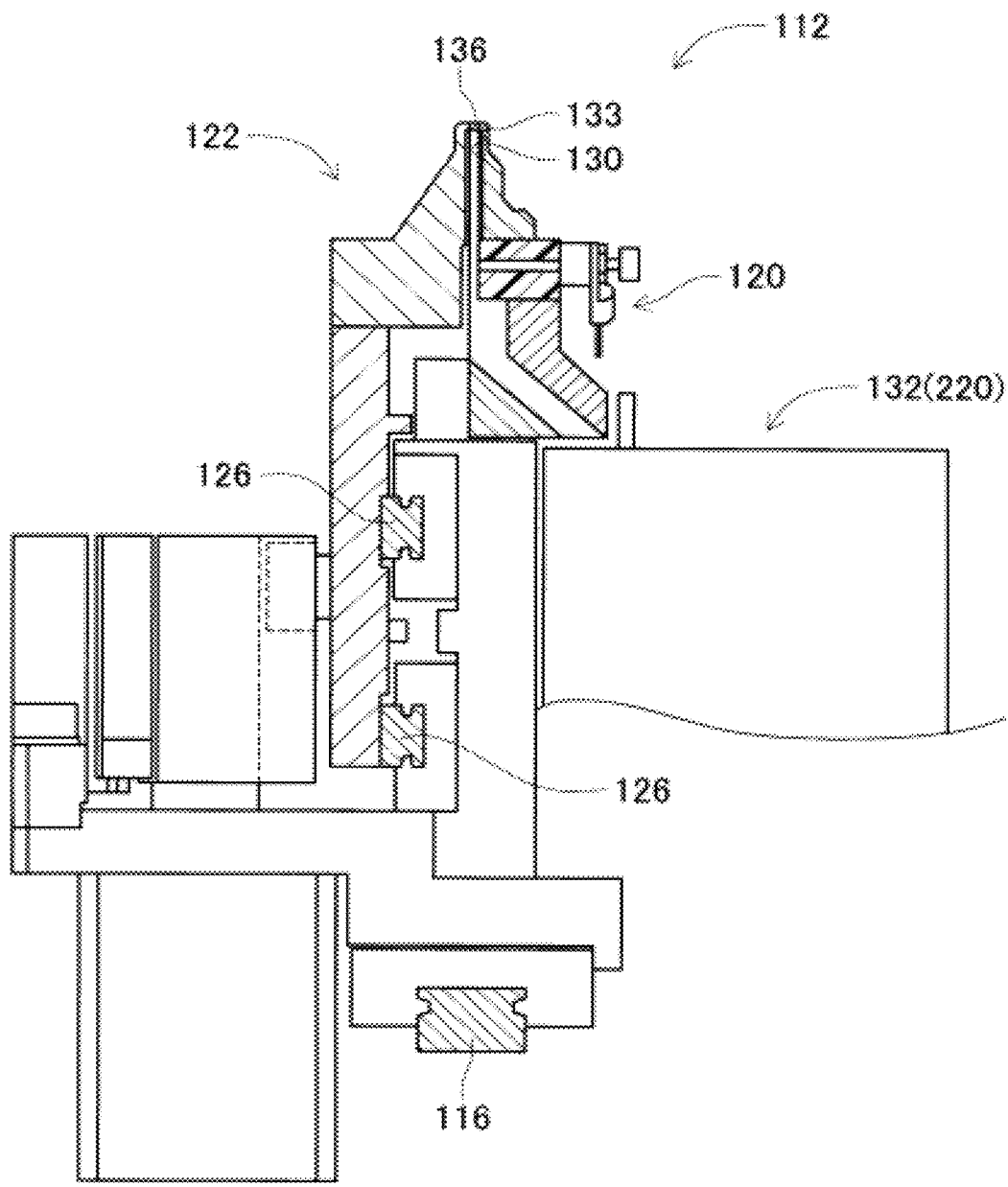
FIG. 5 A sectional view showing a sliding body.

Further, the upper end of fixed portion 120, as shown in FIG. 5, has a tapered shape, and first insertion hole 130 is formed so as to penetrate the upper end in the vertical direction. It should be noted that the edge of the upper face opening of first insertion hole 130 is a fixed blade (see FIG. 7) 131. Further, the lower end of first insertion hole 130 opens toward the front face of fixed portion 120. Then, toward the front of the side face of fixed portion 120 to which the lower end of first insertion hole 130 opens, discard box 132 is fixed to the upper face of unit main body 110, and the opening of the lower end of first insertion hole 130 and the opening of discard box 132 face each other.

On the other side, the upper end of movable portion 122 is also tapered, and bent portion 133, which is bent in an L-shape, is formed at the upper end of movable portion 122. Bent portion 133 extends above the upper face of fixed portion 120. Further, first insertion hole 130, which opens to the upper face of fixed portion 120, is covered by bent portion 133, and second insertion hole 136 is formed in bent portion 133 so as to face first insertion hole 130. It should be noted that the opening edge of the lower end face of bent portion 133 of second insertion hole 136 is a movable blade (see FIG. 7) 138.

Further, unit moving device 102, as shown in FIG. 3, has X-direction moving device 150, Y-direction moving device 152, Z-direction moving device 154, and rotation device 156. X-direction moving device 150 includes slide rails 160 and an X slider 162. Slide rails 160 are disposed so as to extend in the X-direction, and X-slider 162 is slidably held by slide rails 160. X-slider 162 moves in the X-direction by the driving of electromagnetic motor (see FIG. 6) 164. Y-direction moving device 152 includes slide rails 166 and Y-slider 168. Slide rails 166 are disposed on X-slider 162 so as to extend in the Y-direction, and Y-slider 168 is slidably held by slide rails 166. Y-slider 168 moves in the Y-direction through the driving of electromagnetic motor (see FIG. 6) 170. Z-direction moving device 154 includes slide rails 172 and Z-slider 174. Slide rails 172 are disposed on Y-slider 168 so as to extend in the Z-direction, and Z-slider 174 is slidably held by slide rails 172. Z-slider 174 moves in the Z-direction by the driving of electromagnetic motor (refer to FIG. 6) 176.

Further, rotation device 156 has a generally disk-shaped rotary table 178. Rotary table 178 is rotatably supported on Z-slider 174 about its axis and rotates by the driving of electromagnetic motor (refer to FIG. 6) 180. Cut-and-clinch unit 100 is disposed on rotary table 178. With such a structure, in addition to being moved to any position by X-direction moving device 150, Y-direction moving device 152, and Z-direction moving device 154, cut-and-clinch unit 100 rotates to any angle by rotation device 156. This allows cut-and-clinch unit 100 to be positioned at any position below circuit substrate 12 held by clamping device 52.

Figure 6:
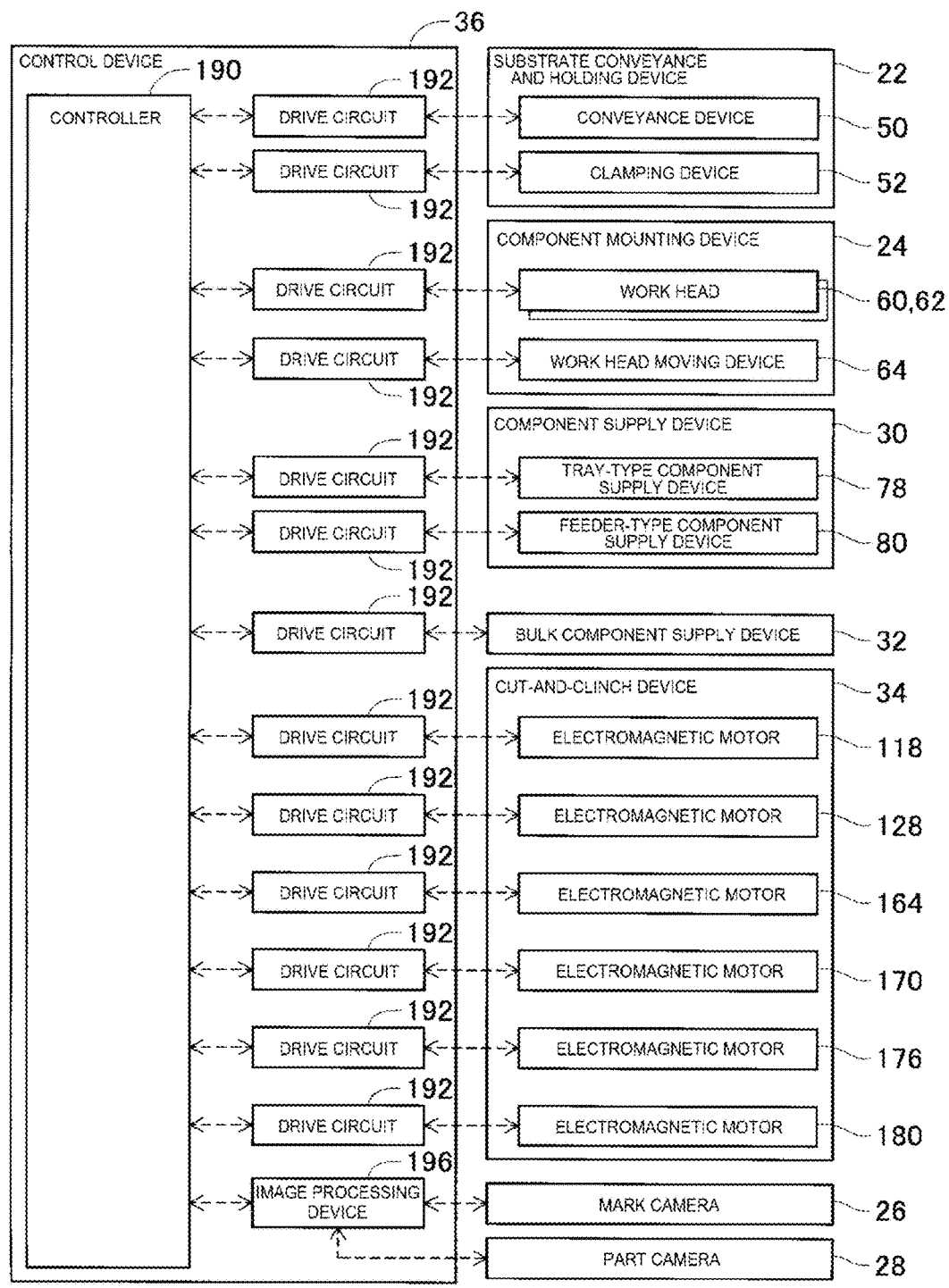
FIG. 6 A block diagram showing a control device.

Control device 36 is provided with controller 190, multiple drive circuits 192, and image processing device 196, as shown in FIG. 6. Multiple drive circuits 192 is connected to conveyance device 50 described above, clamping device 52, work head 60,62, work head moving device 64, tray-type component supply device 78, feeder-type component supply device 80, bulk component supply device 32, and electromagnetic motors 118,128,164,170,176,180. Controller 190 includes a CPU, ROM, RAM, and the like, mainly consists of a computer, and is connected to multiple drive circuits 192. With this, the operation of substrate conveyance and holding device 22, component mounting device 24, and the like is controlled by controller 190. Furthermore, controller 190 is also connected to image processing device 196. Image processing device 196 is for processing image data obtained by mark camera 26 and part camera 28, and controller 190 acquires various information from the image data.

In component mounting machine 10, with the configuration described above, the component mounting operation is performed on circuit substrate 12 held by substrate conveyance and holding device 22. In component mounting machine 10, it is possible to mount various components on circuit substrate 12, and the case of mounting lead component 106 on circuit substrate 12 will be described below.

Specifically, circuit substrate 12 is conveyed to a work position and held at that position in a fixed manner by clamping device 52. Next, mark camera 26 is moved to a position above circuit substrate 12 and images circuit substrate 12. As a result, information on the holding position of circuit base 12 and the like can be obtained. Further, component supply device 30 or bulk component supply device 32 supplies lead component 106 in a predetermined feed position. One of work heads 60,62 is then moved to a position above the supply position of the component and component main body (refer to FIG. 7) 114 of lead component 106 is picked up and held by suction nozzle 66.

Subsequently, work head 60/62 holding lead component 106 moves to a position above part camera 28, and lead component 106 held by suction nozzle 66 is imaged by part camera 28. In this way, information on the component holding position and the like can be obtained. Subsequently, work head 60/62 holding lead component 106 moves above circuit substrate 12 to correct errors in the holding position of circuit substrate 12, errors in the component holding position, and the like. Leads 108 of lead component 106 picked up and held by suction nozzle 66 is inserted into through-holes 104 in circuit substrate 12. When this occurs, cut-and-clinch unit 100 is moved to a position below circuit substrate 12.

Specifically, in cut-and-clinch unit 100, the distance between the pair of sliding bodies 112 is adjusted by the operation of electromagnetic motor 118 so that the distance between second insertion holes 136 of the pair of sliding bodies 112 is the same as the distance between the two through-holes 104 in circuit substrate 12. Further, the operation of rotation device 156 is controlled so that the direction of alignment of the two through-holes 104 of circuit substrate 12 coincides with the direction of alignment of the two second insertion holes 136 of the pair of sliding bodies 112.

Then, by the operation of X-direction moving device 150 and Y-direction moving device 152, cut-and-clinch unit 100 is moved so that the XY direction coordinates of second insertion holes 136 coincide with the XY direction coordinates of through-holes 104 of circuit substrate 12. As a result, cut-and-clinch unit 100 is moved along the XY direction so that second insertion holes 136 of sliding bodies 112 and through-holes 104 of circuit substrate 12 overlap in the vertical direction.

Next, cut-and-clinch unit 100 is raised by the operation of Z-direction moving device 154 such that the upper surface of movable portion 122 is in contact with or slightly lower than the lower surface of circuit substrate 12. In this way, by controlling the operation of X-direction moving device 150, Y-direction moving device 152, Z-direction moving device 154, and rotation device 156, cut-and-clinch unit 100 is disposed below circuit substrate 12 with second insertion holes 136 of sliding bodies 112 and through-holes 104 of circuit substrate 12 overlapping each other.

Figure 7:
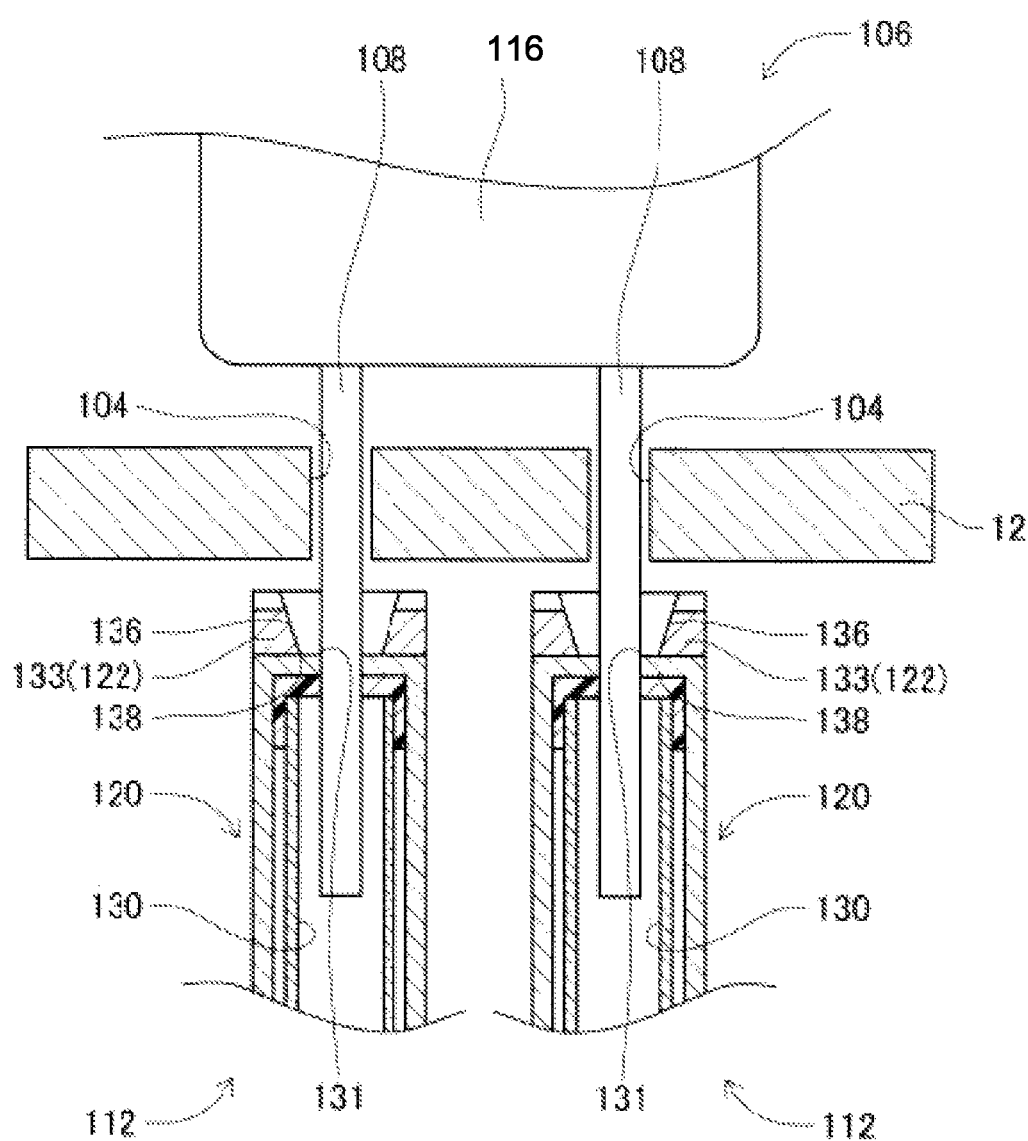
FIG. 7 A schematic diagram showing a cut-and-clinch unit immediately before leads of a lead component are cut.

When lead 108 of lead component 106 picked up and held by suction nozzle 66 is inserted into through-hole 104 of circuit substrate 12, the distal ends of lead 108 is inserted into first insertion hole 130 of fixed portion 120, via second insertion hole 136 of movable portion 122 of cut-and-clinch unit 100, as shown in FIG. 7. Next, when the distal end of lead 108 is inserted into first insertion hole 130 of fixed portion 120, movable portion 122 slides by the operation of electromagnetic motor 128.

Figure 8:
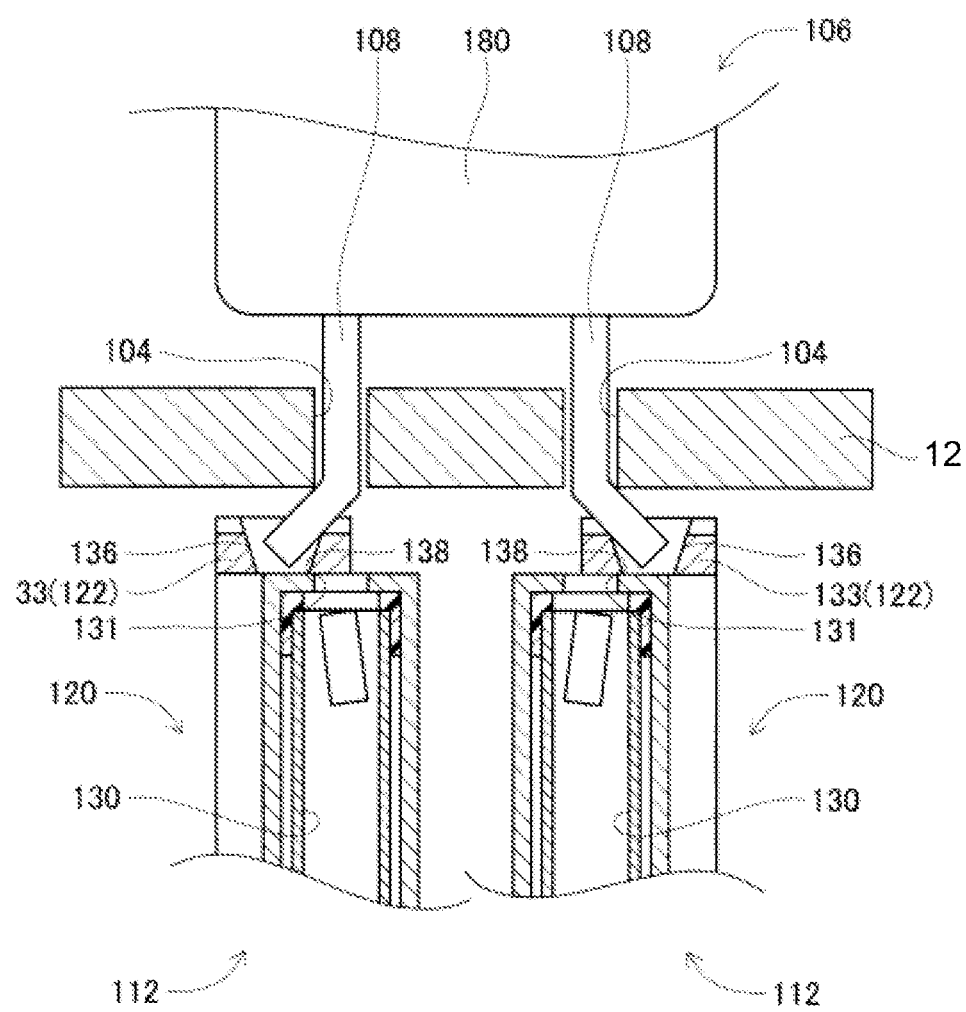
FIG. 8 A schematic diagram showing a cut-and-clinch unit after the leads of the lead component are cut.

Thus, lead 108, as shown in FIG. 8, is cut by fixed blade 131 of first insertion hole 130 and movable blade 138 of second insertion hole 136. The distal end separated by the cutting of lead 108 falls inside first insertion hole 130 and is contained in discard box 132. In addition, the new distal ends of leads 108 due to the cutting are bent along with the sliding of movable portion 122. As a result, lead components 106 are mounted on circuit substrate 12 while leads 108 are prevented from coming out of through-holes 104.

In this way, in component mounting machine 10, it is possible to mount lead component 106 to any position on circuit substrate by moving cut-and-clinch unit 100 by the operation of unit moving device 102 to any position under circuit substrate 12. However, in component mounting machine 10, since discard box 132, in which lead scraps are contained, is fixed to and moves together with cut-and-clinch unit 100, there is a possibility that lead scraps contained in discard box 132 will fly out of discard box 132.

In view of this, discard box 132 is provided with a shielding plate extending inward so as to block the opening. Specifically, as shown in FIGS. 9 to 12, discard box 132 is composed of box member 200 and lid 202. Box member 200 has a box shape that is a generally rectangular parallelepiped, and the upper face of box member 200 is open. The top face of box member 200 is closed by a generally rectangular lid 202. In the following description, the direction along the long side of lid 202 is referred to as the left-right direction, and the horizontal direction perpendicular to the left-right direction is referred to as the front-rear direction.

The upper face of lid 202 has a generally rectangular opening 206 extending alongside the edge of one side in the front-rear direction. Of the pair of long sides defining opening 206, inclined plate 208 is fixed to the side close to the edge of the upper face of lid 202, and the upper end of inclined plate 208 extends diagonally upwards and away from opening 206. It should be noted that the inclination angle of inclined plate 208 is set to about 35 degrees.

Discard box 132 is disposed so that the lower edge of the opening of first insertion hole 130 in fixed portion 120 of cut-and-clinch unit 100 is positioned above inclined plate 208. With this configuration, lead scraps discharged from first insertion hole 130 fall onto inclined plate 208, via opening 206, and are contained inside discard box 132. As described above, discard box 132 is fixed to cut-and-clinch unit 100, and moves and rotates together with cut-and-clinch unit 100. Therefore, the relative positions of cut-and-clinch unit 100 and discard box 132 do not change, thereby ensuring that lead scraps discarded from cut-and-clinch unit 100 are appropriately contained in discard box 132.

Further, in lid 202 of discard box 132, of the pair of long sides defining opening 206, shielding plate 210 is disposed on the long side facing the long side to which inclined plate 208 is fixed. The upper end of shielding plate 210 is fixed to lid 202 and extends directly downward and then bends in a direction blocking opening 206, that is, toward the side wall of discard box 132. It should be noted here that the angle of inclination of shielding plate 210 is about 35 degrees. The bent end of shielding plate 210 is inclined obliquely downward, and extends to a position below the lower end of inclined plate 208. With this configuration, opening 206 of discard box 132 is blocked by shielding plate 210 inside disposal box 132 so that lead scraps contained in discard box 132 are prevented from flying out of discard box 132.

That is, the lead scraps discharged from first insertion hole 130 of cut-and-clinch unit 100 drop onto inclined plate 208 in discard box 132 and slide down inclined plate 208. The lead scraps fall onto shielding plate 210, via opening 206, and slide on shielding plate 210. Thus, the lead scraps pass between the lower end of shielding plate 210 and the side wall of discard box 132, and are contained inside discard box 132. Thus, the lead scraps contained inside discard box 132 are prevented from flying out of discard box 132 because opening 206 of discard box 132 is shielded by shielding plate 210.

However, discard box 132, together with cut-and-clinch unit 100, not only moves in the horizontal direction but also moves in the up-down direction and rotates around an axis extending in the up-down direction, therefore making it possible for lead scraps that have been contained to fly out from discard box 132. For example, when discard box 132 containing lead scraps is rotated, the lead scraps move along the side wall inside discard box 132. Therefore, if discard box 132 descends while discard box 132 rotates or immediately after rotation stops, lead scraps will rise while moving along the side wall of discard box 132. When this occurs, lead scraps inside discard box 132 move in the direction of arrow 212 shown in FIG. 11, get on shielding plate 210 from both side edges in the left-right direction of shielding plate 210, thereby making it possible for lead scraps to fly out from the opening of discard box 132. Further, it is also possible for lead scraps inside discard box 132 to fly out from the opening of discard box 132 by climbing up shielding plate 210 from the lower end of shielding plate 210 rather than the side edges on both sides of shielding plate 210.

In other words, when lead scraps are discharged from first insertion hole 130 during rotation of discard box 132, it is possible that lead scraps falling on inclined plate 208 of discard box 132 will not slide off and will not be contained by discard box 132. Specifically, if lead scraps fall onto inclined plate 208 during rotation of discard box 132, the lead scraps are rotated, along with the rotation of discard box 132, in the direction of arrow 216, shown in FIG. 12, along the upper surface of inclined plate 208. As this occurs, if discard box 132 descends, the lead scraps may rise up from inclined plate 208 and fly out of discard box 132. That is, there is a possibility that, before entering inside discard box 132, lead scraps discharged from first insertion hole 130 will not pass through opening 206 of discard box 132 and fly out of discard box 132.

Figure 13:
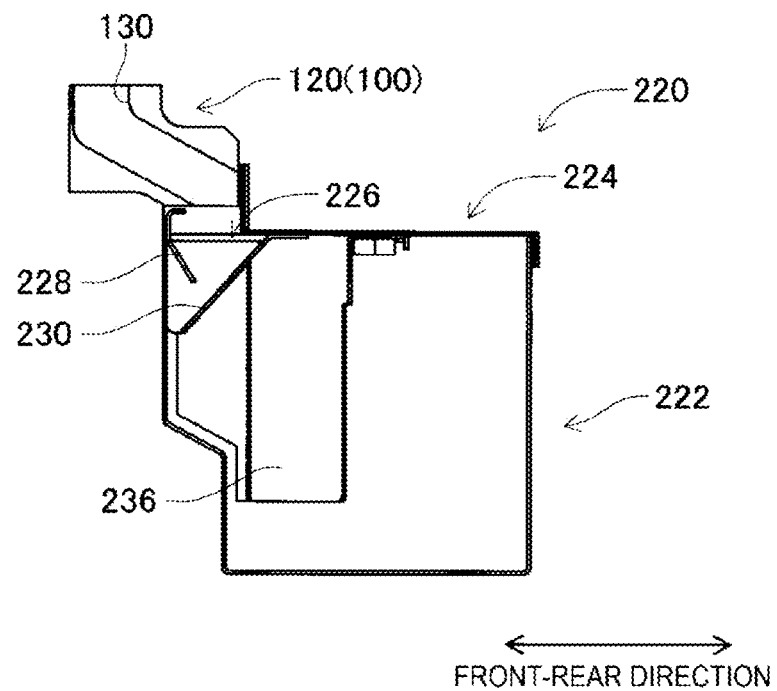
FIG. 13 A sectional view of a discard box.
Figure 14:
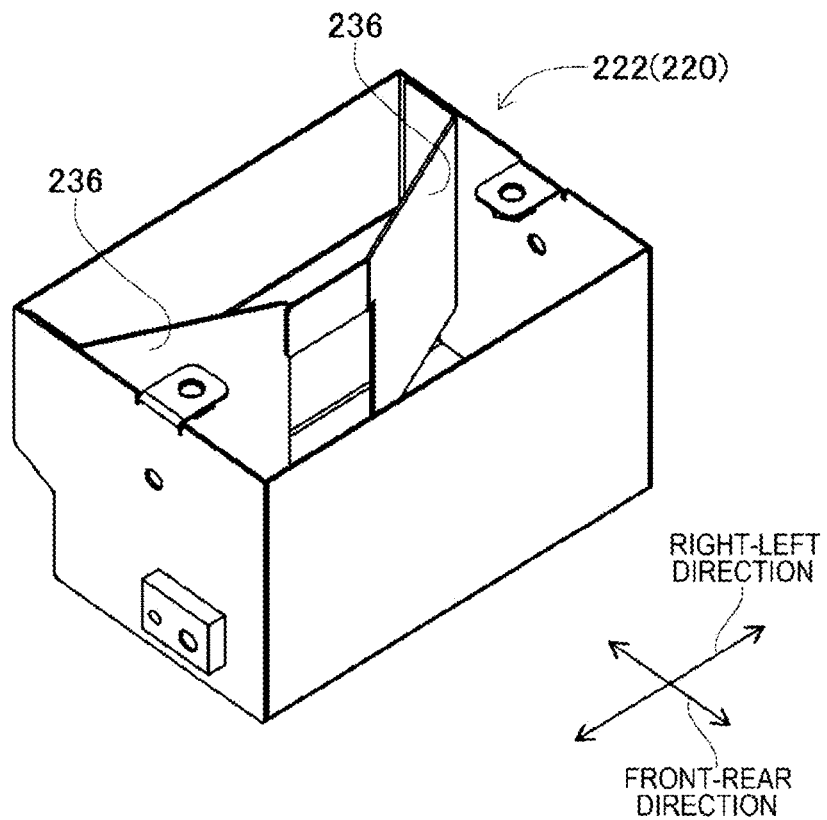
FIG. 14 A perspective view showing a box member of the discard box of FIG. 13.
Figure 15:
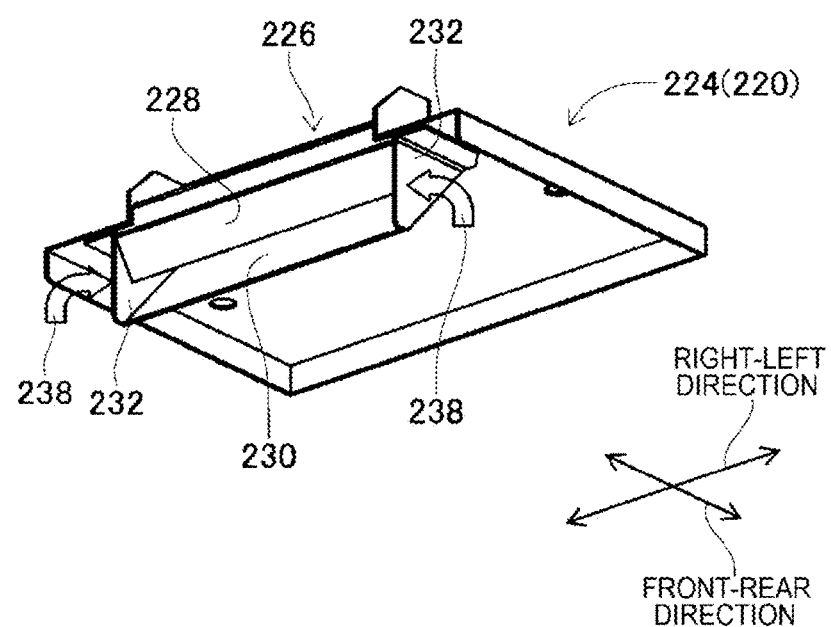
FIG. 15 A perspective view showing a lid of the discard box of FIG. 13.

In view of the above, by employing discard box 220 shown in FIGS. 13 to 15 instead of discard box 132, it is possible to solve the above-mentioned problem and ensure appropriate containment of lead scraps in the discard box. Specifically, discard box 220 is composed of box member 222 and lid 224, and box member 222 has a box shape of a generally rectangular parallelepiped, and the upper face of box member 222 is open. The upper face of box member 222 is closed with lid 224.

The upper face of lid 224 has a generally rectangular opening 226 extending alongside the edge of one side in the front-rear direction. Of the pair of long sides defining opening 226, inclined plate 228 is fixed to the inner wall surface of the long side close to the edge of the upper face of lid 224 so as to extend in the up-down direction. The upper end of inclined plate 228 is bent generally at a right angle in a direction away from the side wall of discard box 220. On the other hand, the lower end of inclined plate 228 is bent generally 20 degrees away from the side wall of discard box 220.

Further, in lid 224 of discard box 220, of the pair of long sides defining opening 226, shielding plate 230 is disposed on the long side facing the long side to which inclined plate 228 is fixed. The upper end of shielding plate 230 is fixed to lid 224, and is bent in a direction so as to block opening 226, that is, toward the side wall of discard box 220, about 50 degrees obliquely downward. The lower end of shielding plate 230 extends out to a position below the lower end of inclined plate 228 and close to the side wall of discard box 220. Further, a pair of side wall plates 232 are fixed on both side edges, in the left-right direction, of shielding plate 230. Side wall plate 232 has a generally triangular shape and is fixed to the side edge of shielding plate 230 and the underside face of lid 224 so as to close the gap between the side edge of shielding plate 230 and the underside face of lid 224.

Discard box 220 is disposed so that the lower edge of the opening of first insertion hole 130 in fixed portion 120 of cut-and-clinch unit 100 is positioned above shielding plate 230. With this configuration, lead scraps discharged from first insertion hole 130 fall onto shielding plate 230, via opening 226, and are contained inside discard box 220. In other words, in discard box 132, lead scraps discharged from first insertion hole 130 pass through opening 206 after falling onto inclined plate 208, but in discard box 220, lead scraps discharged from first insertion hole 130 pass directly through opening 226.

Further, a pair of partition plates 236 extending from the side walls, in the left-right direction, toward the inside are disposed in box member 222. Partition plates 236 are disposed extending in the up-down direction, that is, extending from the bottom face to the top face of discard box 220. Partition plates 236 extend from a position, close to opening 226, on each side wall in the left-right direction, and extend obliquely in a direction, away from opening 226, toward the inside of box member 222. That is, the pair of partition plates 236 partitions the inside of discard box 220 so as to make the distance between partition plates 236 smaller in the left-right direction the further away partition plates 236 are from opening 226 in the front-rear direction. The ends of the pair of partition plates 236 extending toward the inside of box member 222 are spaced apart, and between the ends of the pair of partition plates 236 there is a clearance that is larger than the lead scraps.

In discard box 220, this configuration ensures appropriate containment of lead scraps in discard box 220. Specifically, as described above, lead scraps discharged from first insertion hole 130 directly pass through opening 226 and fall onto shielding plate 230 disposed inside discard box 220. With this configuration, it is possible to prevent lead scraps discharged from first insertion hole 130 from flying out of discard box 220 before entering inside discard box 220. Further, even if lead scraps fall on the upper surface of shielding plate 230, and move on the upper surface with the rotation of discard box 220 and rise up from shielding plate 230 with the lowering of discard box 220, the lead scraps are prevented from flying out of discard box 220 because of inclined plate 228. This is because inclined plate 228 is disposed obliquely above shielding plate 230, and the upper end of inclined plate 228 is bent at a right angle in a direction that blocks opening 226. In other words, shielding plate 230 of discard box 220 is steeper than shielding plate 210 of discard box 132, increasing the sliding speed of lead scraps, and thus appropriately preventing lead scraps from flying out of discard box 220.

Figure 11:
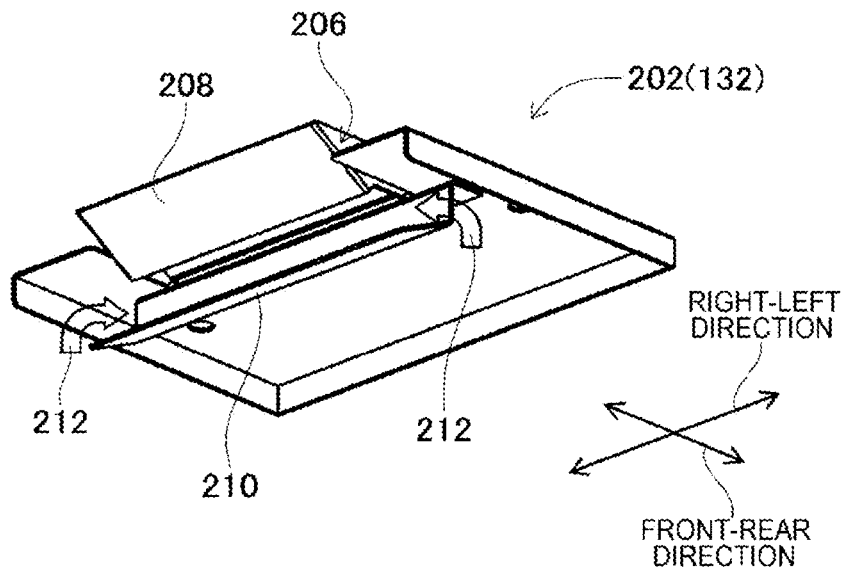
FIG. 11 A perspective view showing a lid of the discard box of FIG. 9.
Figure 12:
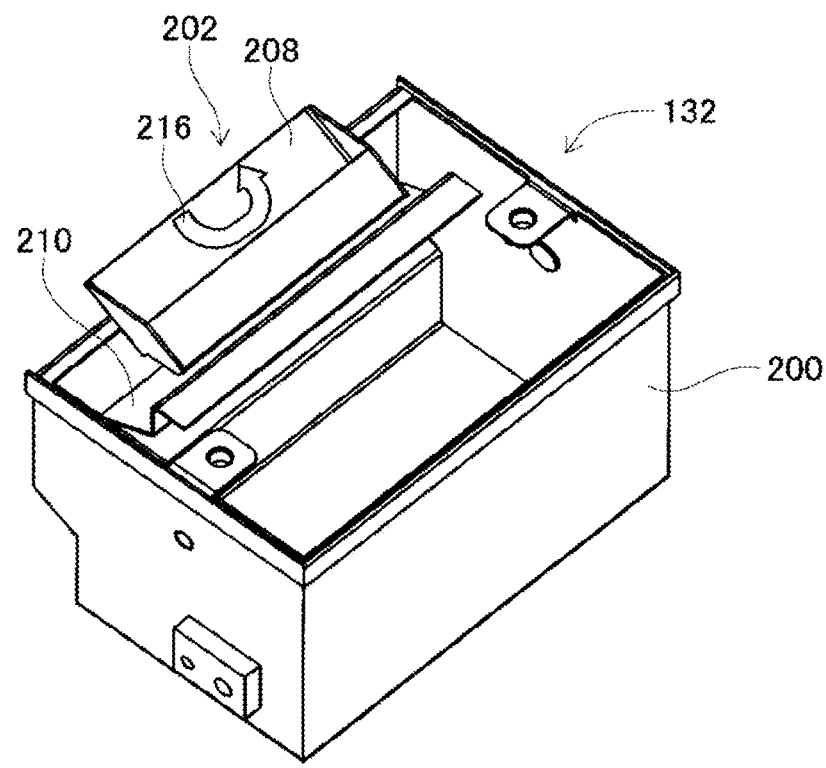
FIG. 12 A transparent view of the discard box of FIG. 9.

Further, in discard box 132, lead scraps inside discard box 132 move in the direction of arrow 212 shown in FIG. 11 due to the rotation and lowering of discard box 132, get on shielding plate 210 from both side edges in the left-right direction of shielding plate 210, thereby making it possible for lead scraps to fly out from the opening of discard box 132. On the other hand, in discard box 220, even if lead scraps inside discard box 220 move in the direction of arrow 238 shown in FIG. 15 due to the rotation and lowering of discard box 220, the lead scraps are blocked by side wall plates 232 and do not get on shielding plate 230 from both side edges of shielding plate 230 in the left-right direction. As a result, lead scraps are appropriately prevented from flying out of discard box 220.

Figure 9:
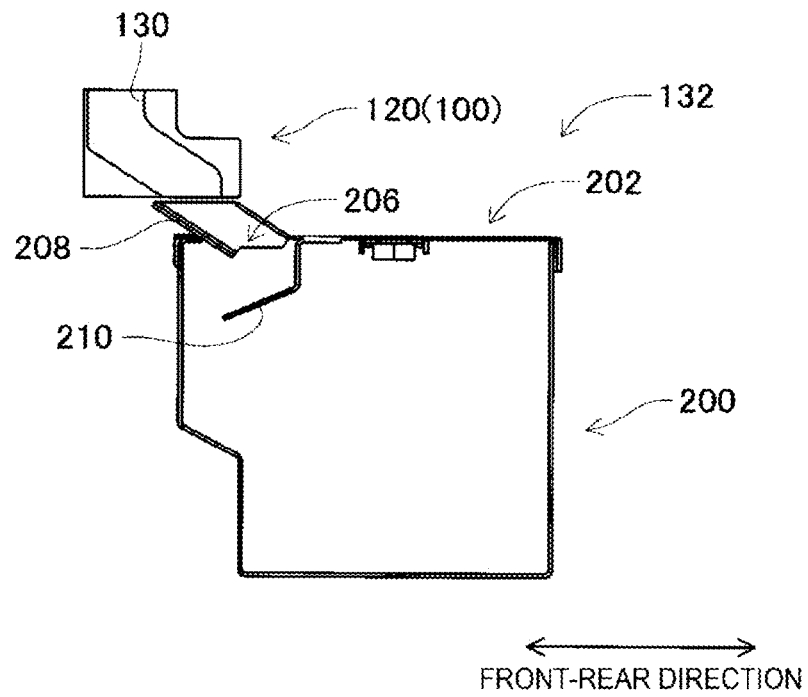
FIG. 9 A sectional view of a discard box.
Figure 10:
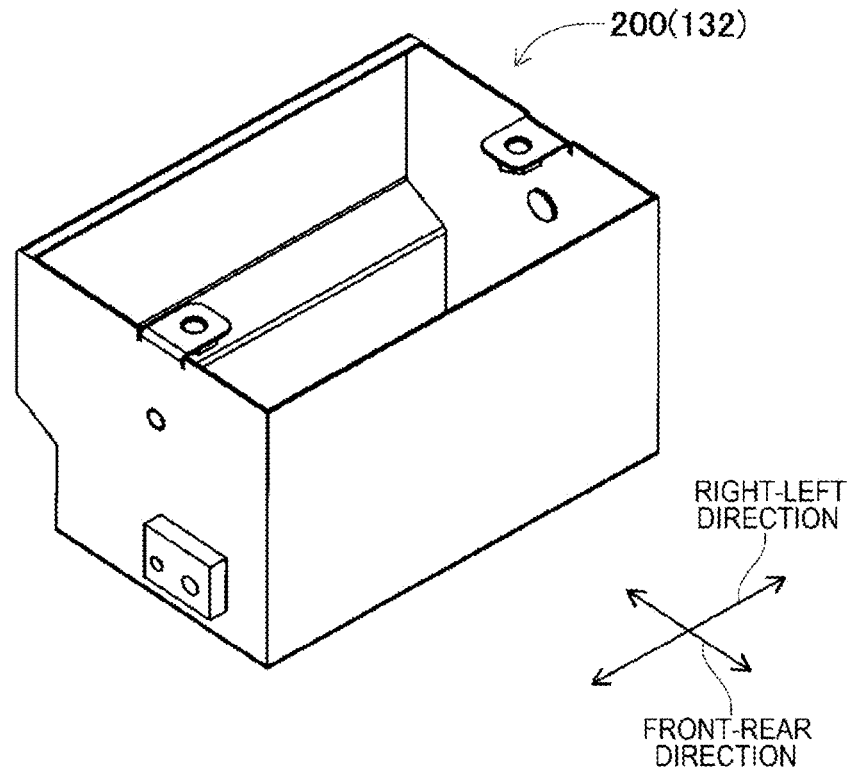
FIG. 10 A perspective view showing a box member of the discard box of FIG. 9.

Further, as can be seen by comparing FIGS. 9 and 13, the gap between the lower end of shielding plate 230 of discard box 220 and the side wall of discard box 220 is much smaller than the gap between the lower end of shielding plate 210 of discard box 132 and the side wall of discard box 132. With this configuration, lead scraps are prevented from climbing up shielding plate 230 from the lower end of shielding plate 230, and the lead scraps are appropriately prevented from flying out of discard box 220.

In other words, the inside of discard box 220 is partitioned by the pair of partition plates 236, and lead scraps contained in discard box 220 cannot go around the side wall of discard box 220 even if discard box 220 is rotated. Further, the pair of partition plates 236 partitions the inside of discard box 220 so as to make the distance between partition plates 236 smaller in the left-right direction the further away partition plates 236 are from opening 226 in the front-rear direction. As a result, in regard to the two spaces inside discard box 220 partitioned by the pair of partition plates 236, when lead scraps are contained in the space without opening 226, it is difficult for the lead scraps to move to the space with opening 226. In this manner, partitioning the inside of discard box 220 with the pair of partition plates 236 appropriately prevents lead scraps from flying out of discard box 220.

Figure 16:
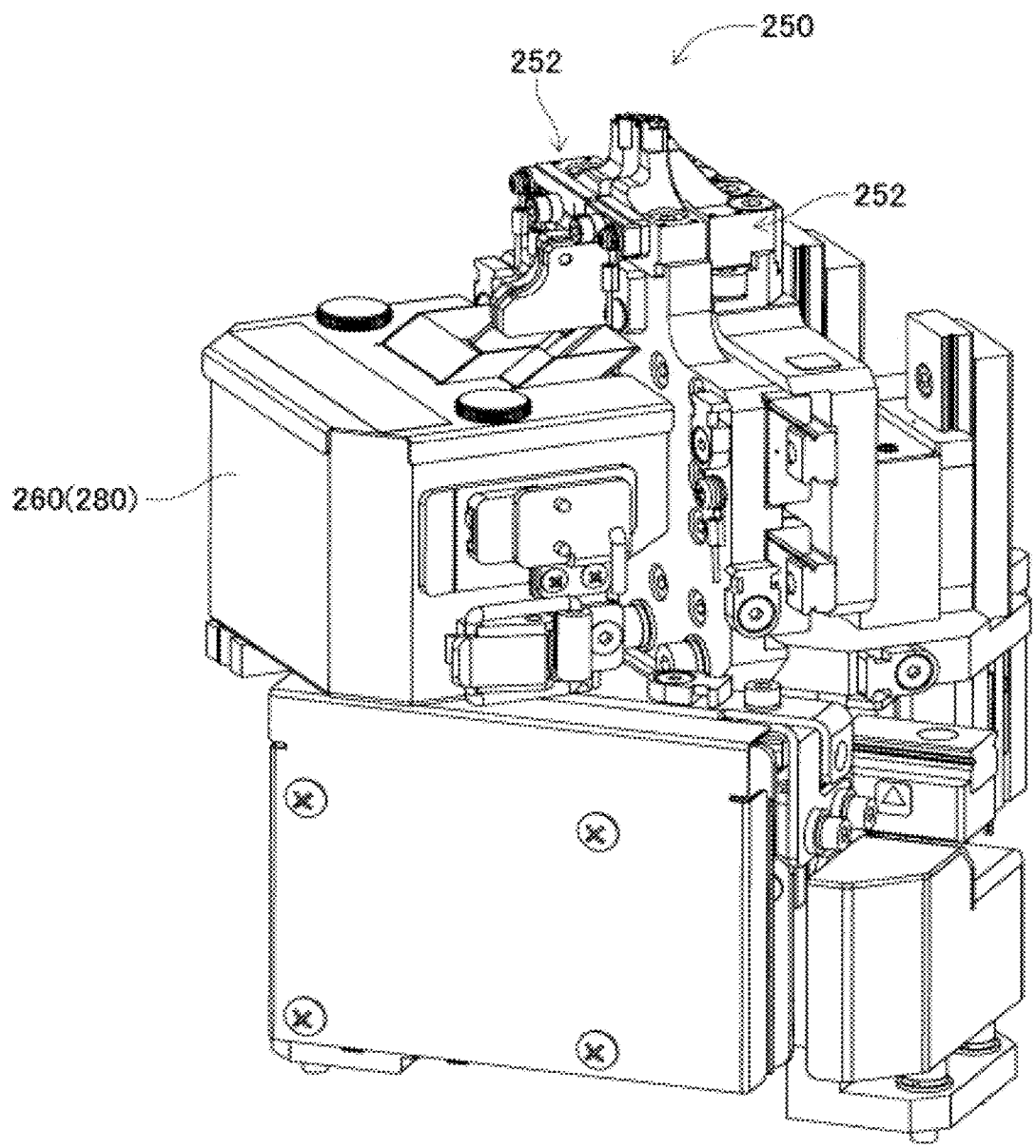
FIG. 16 A perspective view showing a cut-and-clinch unit.

Further, in component mounting machine 10, it is also possible to use cut-and-clinch unit 250 shown in FIG. 16 instead of cut-and-clinch unit 100. In cut-and-clinch unit 250, aside from the sliding direction of sliding body 252 being different from the sliding direction of sliding body 112 of cut-and-clinch unit 100, and that the leads of the lead component is bent in an N-shape, cut-and-clinch unit 250 has substantially the same structure as cut-and-clinch unit 100. Further, a detailed structure of cut-and-clinch unit 250 is described in WO 2017/081724 already filed by the applicant of the present specification. Therefore, details of the structure of cut-and-clinch unit 250 are omitted, and in the following description, the same components as those of cut-and-clinch unit 100 are denoted by the reference numerals used in cut-and-clinch unit 100.

Figure 17:
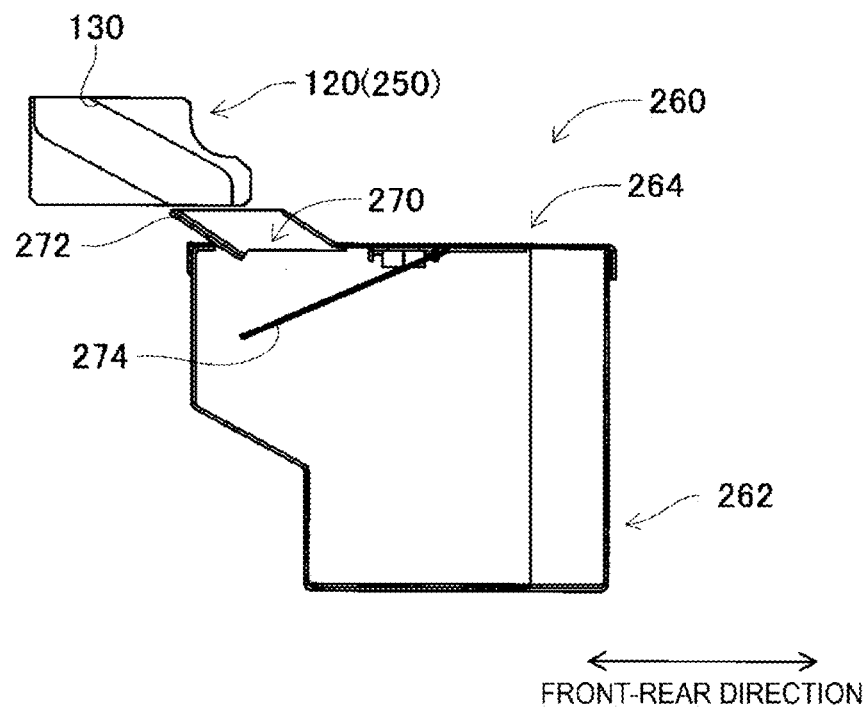
FIG. 17 A sectional view of a discard box.
Figure 18:
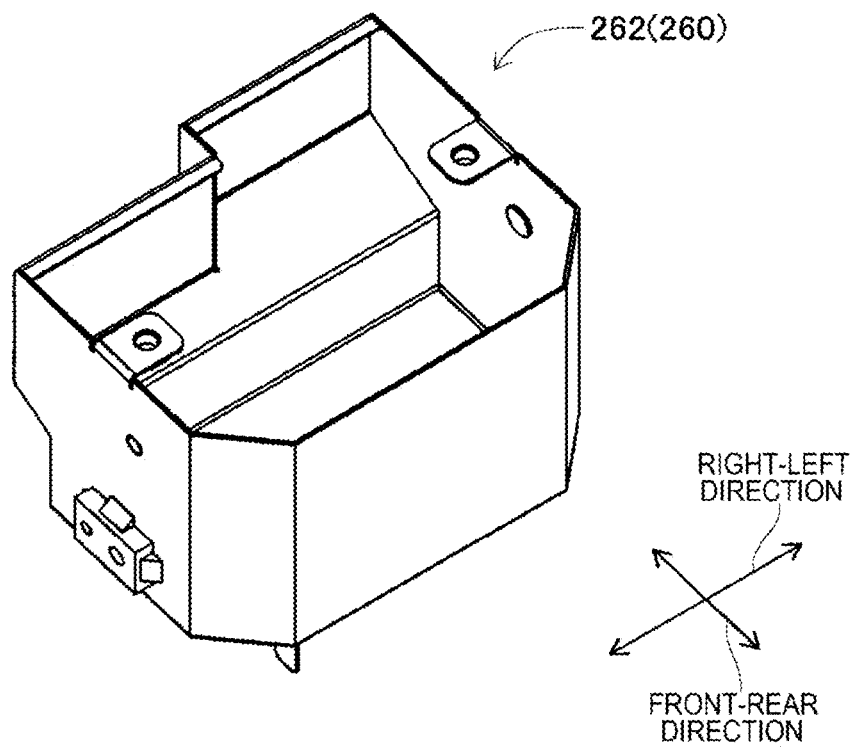
FIG. 18 A perspective view showing a box member of the discard box of FIG. 17.
Figure 19:
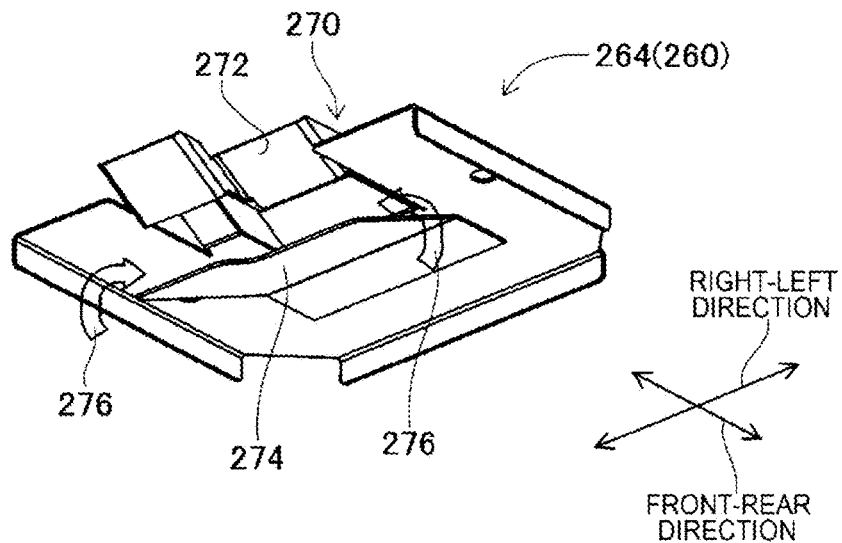
FIG. 19 A perspective view showing a lid of the discard box of FIG. 17.

In cut-and-clinch unit 250, since the sliding direction of sliding body 252 is different from that of cut-and-clinch unit 100, a discard box having a structure different from that of discard boxes 132,220 is used. Specifically, discard box 260 shown in FIGS. 17 to 19 is used. Similarly to discard box 132, discard box 260 is composed of box member 262 and lid 264, and lid 264 has opening 270, inclined plate 272, and shielding plate 274. Since opening 270, inclined plate 272, and shielding plate 274 of discard box 260 have substantially the same structure as opening 206, inclined plate 208, and shielding plate 210 of discard box 132, description of their details are omitted.

In discard box 260 having such a structure, since opening 270 of discard box 260 is blocked by shielding plate 274, lead scraps contained in discard box 260 are prevented from flying out of discard box 260. However, in discard box 260, similarly to discard box 132, lead scraps inside discard box 260 may move in the direction of arrows 276 shown in FIG. 19 and fly out from opening 270 of discard box 260. Further, there is a possibility that lead scraps falling on inclined plate 272 will fly out from discard box 260 as a result of moving on the upper surface of inclined plate 272 with the rotation of discard box 260 and rising up from inclined plate 272 with the lowering of discard box 260.

Figure 20:
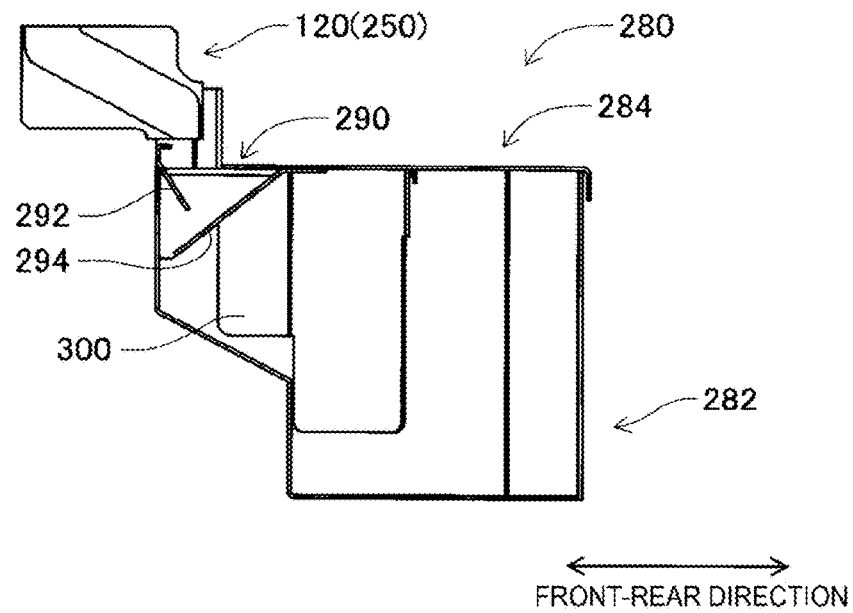
FIG. 20 A sectional view of a discard box.
Figure 21:
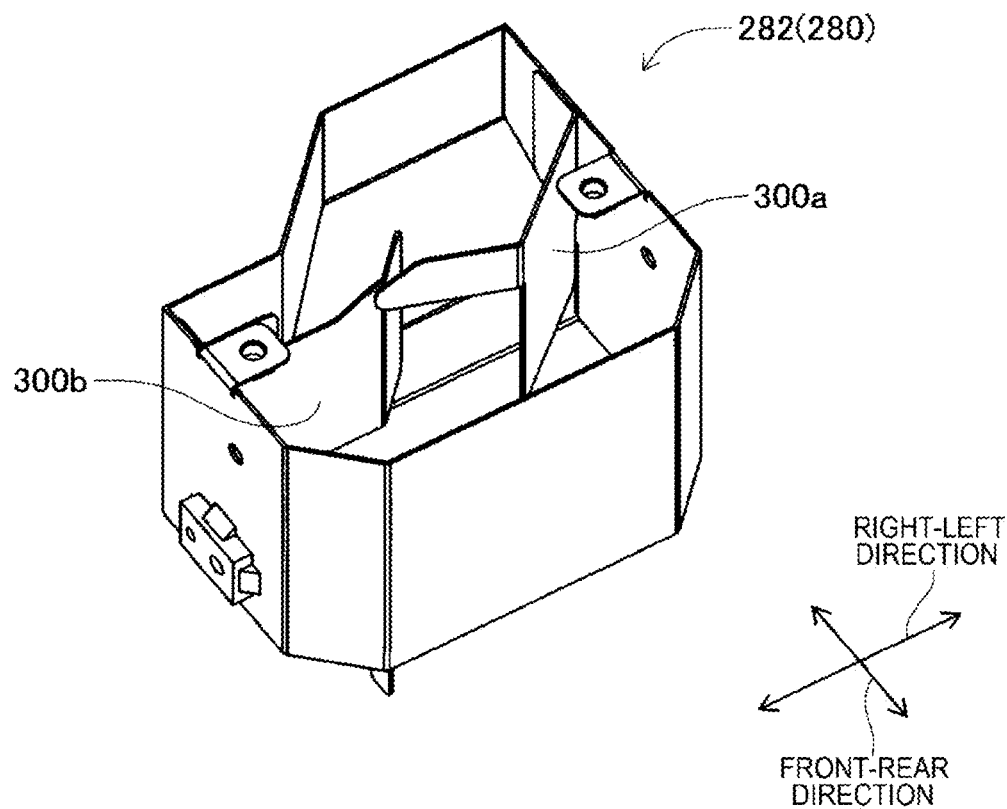
FIG. 21 A perspective view showing a box member of the discard box of FIG. 20.
Figure 22:
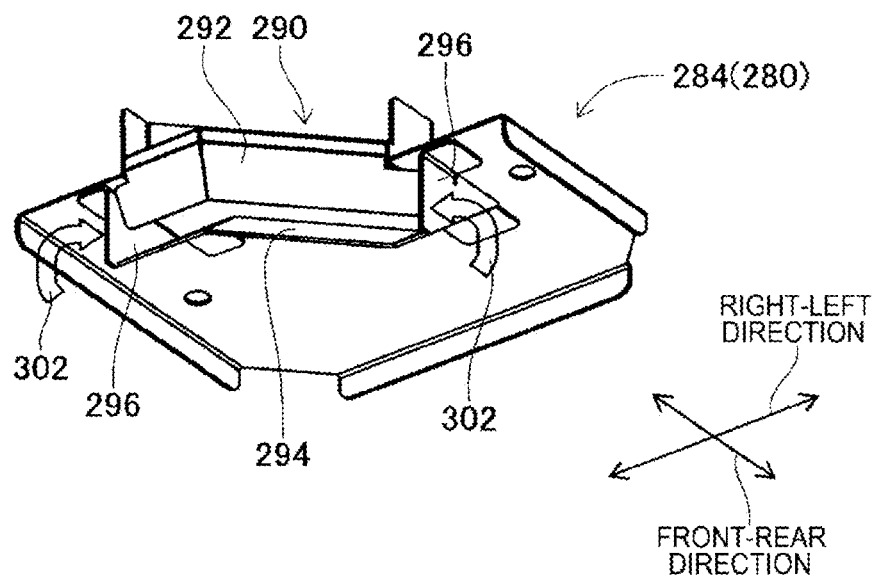
FIG. 22 A perspective view showing a lid of the discard box of FIG. 20.

Therefore, by using discard box 280 shown in FIGS. 20 to 22 instead of discard box 260, the above-mentioned problem can be solved and it becomes possible to ensure appropriate containment of lead scraps in the discard box. Specifically, discard box 280 is composed of box member 282 and lid 284, similarly to discard box 220. Lid 284 has opening 290, inclined plate 292, shielding plate 294 and a pair of side wall plates 296, and box member 282 has a pair of partition plates 300. Further, since opening 290, inclined plate 292, shielding plate 294, the pair of side wall plates 296, and the pair of partition plates 300 of discard box 280 have substantially the same structure as opening 226, inclined plate 228, shielding plate 230, the pair of side wall plates 232, and the pair of partition plates 236 of discard box 220, description of their details are omitted.

In discard box 280, by having such a configuration, the same effect as that of discard box 220 can be achieved. Specifically, for example, even if lead scraps fall on the upper surface of shielding plate 294, and move on the upper surface of shielding plate 294 with the rotation of discard box 280 and rise up from shielding plate 294 with the lowering of discard box 280, the lead scraps are prevented from flying out of discard box 280 because of inclined plate 292.

Further, in discard box 280, even if lead scraps inside discard box 280 move in the direction of arrow 302 shown in FIG. 22 due to the rotation and lowering of discard box 280, the lead scraps are blocked by side wall plates 296 and do not climb up shielding plate 294 from both side edges of shielding plate 294 in the left-right direction. Further, partitioning the inside of discard box 280 with the pair of partition plates 300 suppresses the movement of lead scraps inside discard box 280 and thereby appropriately prevents the lead scraps from flying out of discard box 280.

In discard box 280, in order to avoid contact with sliding body 252, which slides, as shown in FIG. 21, the corners of box member 282 are recessed. Therefore, the internal volume of discard box 280 is different in the left-right direction. Partition plate 300a disposed on the side of the left-right direction in which the internal volume is larger is disposed inclined away from opening 290, and partition plate 300b disposed on the side of the left-right direction in which the internal volume is smaller is not disposed away from opening 290 and is disposed without being inclined. Therefore, in the space which does not include opening 290, the internal volume of discard box 280 partitioned by partition plate 300a is equal to the internal volume of discard box 280 partitioned by partition plate 300b. As a result, in the space which does not include opening 290, lead scraps easily move between the portion partitioned by partition plate 300a and the portion partitioned by partition plate 300b, and movement of lead scraps to the space which does not include opening 290 is suppressed. This also appropriately prevents lead craps from flying out of discard box 280.

Further, component mounting machine 10 is an example of a lead component mounting system. Cut-and-clinch device 34 is an example of a lead-cutting system. Work heads 60,62 are examples of holding heads. Work head moving device 64 is an example of a head moving device. Cut-and-clinch unit 100 is an example of a cutting device. Unit moving device 102 is an example of a moving device. Discard box 132 is an example of a container. Rotation device 156 is an example of a rotation device. Rotary table 178 is an example of a rotary table. Opening 206 is an example of an opening. Shielding plate 210 is an example of a shielding plate. Discard box 220 is an example of a container. Opening 226 is an example of an opening. Shielding plate 230 is an example of a shielding plate. Partition plate 236 is an example of a partition plate. Cut-and-clinch unit 250 is an example of a cutting device. Discard box 260 is an example of a container. Opening 270 is an example of an opening. Shielding plate 274 is an example of a shielding plate. Discard box 280 is an example of a container. Opening 290 is an example of an opening. Shielding plate 294 is an example of a shielding plate. Partition plate 300 is an example of a partition plate.

It should be noted that the present disclosure is not limited to the above examples and can be implemented in various modes in which various changes and improvements are made based on the knowledge of those skilled in the art. Specifically, in the above embodiment, for example, the inclination angle of inclined plate 208 of discard box 132 is specifically limited, but the angle can be set to any angle.

In the above embodiment, a case where the lead scraps contained in discard box 132 are scattered when discard box 132 or the like is rotating and descending has been described, but naturally, the lead scraps may be scattered even when discard box 132 or the like is ascending or moving in a horizontal direction. In discard box 132 and the like, it is possible to ensure appropriate containment of lead scraps in the discard box under all of these circumstances.

REFERENCE SIGNS LIST

10: Component mounting machine (lead component mounting system), 34: Cut-and-clinch device (lead-cutting system), 60: Work head (holding head), 62: Work head (holding head), 64: Work head moving device (head moving device), 100: Cut-and-clinch unit (cutting device), 102: Unit moving device, 132: Discard box (container), 156: Rotation device, 178: Rotary table, 206: Opening, 210: Shielding plate, 220: Discard box (container), 226: Opening, 230: Shielding plate, 236: Partition plate, 250: Cut-and-clinch unit, 260: Discard box (container), 270: Opening, 274: Shielding plate, 280: Discard box (container), 290: Opening, 294: Discard box (container), 300: Partition.

The invention claimed is:

1. A lead-cutting system, comprising:
a rotary table configured to rotate;
a cutting device, being disposed on the rotary table, which is configured to cut leads of a lead component that is inserted into through-holes in a board;
a container, being disposed on the rotary table together with the cutting device, which contains the leads cut by the cutting device; and
a Z-direction moving device configured to move the rotary table in a vertical direction,
wherein the container comprises
an opening for receiving leads cut by the cutting device therein,
a shielding plate extending toward a side wall of the container so as to block the opening, and
an inclined plate disposed obliquely above the shielding plate.

2. The lead-cutting system of claim 1, wherein the lead-cutting system further comprises a X-direction moving device configured to move the rotary table in a horizontal direction, and
wherein the container further comprises a partition plate extending toward an upper surface of the container so as to partition a portion of the interior.

3. A lead component mounting system, comprising:
the lead-cutting system according to claim 1;
a holding head configured to hold the lead component; and
a head moving device configured to move the holding head so that the leads of the lead component held by the holding head are inserted into the through-holes in the board.

4. The lead-cutting system of claim 1, wherein an upper end of the inclined plate is bent at a right angle in a direction that blocks the opening.

5. A lead component mounting system, comprising:
the lead-cutting system according to claim 2;
a holding head configured to hold the lead component; and
a head moving device configured to move the holding head so that the leads of the lead component held by the holding head are inserted into the through-holes in the board.

* * * * *